United States Patent
Marker

(10) Patent No.: US 8,717,751 B2
(45) Date of Patent: May 6, 2014

(54) PROTECTIVE ENCLOSURE

(76) Inventor: Thomas Michael Marker, Howell, NJ (US)

( * ) Notice: Subject to any disclaimer, the term of this patent is extended or adjusted under 35 U.S.C. 154(b) by 188 days.

(21) Appl. No.: 13/016,843

(22) Filed: Jan. 28, 2011

(65) Prior Publication Data

US 2012/0194971 A1   Aug. 2, 2012

(51) Int. Cl.
*G06F 1/16* (2006.01)
*H05K 5/00* (2006.01)
*H05K 7/00* (2006.01)
*H05K 7/20* (2006.01)
*G06F 1/20* (2006.01)

(52) U.S. Cl.
USPC ............... 361/679.21; 361/679.3; 361/679.4; 361/679.01; 361/679.55; 361/679.48; 361/379.26; 361/679.09; 361/679.02

(58) Field of Classification Search
USPC ............. 361/679, 679.01, 679.1–679.6, 681, 361/683, 687
See application file for complete search history.

(56) References Cited

U.S. PATENT DOCUMENTS

| | | | | |
|---|---|---|---|---|
| 4,758,712 A * | 7/1988 | Matone et al. | ............ | 235/145 R |
| 5,122,928 A * | 6/1992 | Lo | ............ | 361/679.01 |
| 5,253,139 A * | 10/1993 | Satou | ............ | 361/679.09 |
| 6,914,772 B2 * | 7/2005 | Hesse et al. | ............ | 361/679.23 |
| 6,919,678 B2 * | 7/2005 | Ozolins et al. | ............ | 313/479 |
| 7,151,662 B2 * | 12/2006 | Tarkoff et al. | ............ | 361/679.01 |
| 7,511,630 B2 * | 3/2009 | Strickland et al. | ............ | 340/815.4 |
| 7,623,958 B1 * | 11/2009 | Laverick et al. | ............ | 701/444 |
| 2003/0184961 A1 * | 10/2003 | Ahn | ............ | 361/683 |
| 2004/0112143 A1 * | 6/2004 | Richardson | ............ | 73/856 |
| 2006/0023412 A1 * | 2/2006 | Schedivy | ............ | 361/683 |
| 2007/0080446 A1 * | 4/2007 | Maloney | ............ | 257/704 |
| 2008/0297998 A1 * | 12/2008 | Choi | ............ | 361/681 |
| 2008/0316687 A1 * | 12/2008 | Richardson et al. | ............ | 361/680 |
| 2009/0040698 A1 * | 2/2009 | Merz et al. | ............ | 361/679.36 |
| 2009/0097191 A1 * | 4/2009 | Roberts et al. | ............ | 361/679.01 |
| 2009/0231808 A1 * | 9/2009 | Burgner | ............ | 361/695 |
| 2009/0257207 A1 * | 10/2009 | Wang et al. | ............ | 361/752 |

* cited by examiner

*Primary Examiner* — Anthony Haughton
*Assistant Examiner* — Zhengfu Feng
(74) *Attorney, Agent, or Firm* — Superior IP, PLLC; Dustin L. Call

(57) ABSTRACT

One example embodiment includes a system for protecting an electronic display. The system includes an enclosure. The enclosure is configured to receive an electronic display. The system also includes a cover, where the cover is configured to cover the electronic display and attachment means, where the attachment means attaches the enclosure to the electronic display.

20 Claims, 6 Drawing Sheets

PROTECTIVE ENCLOSURE

CROSS-REFERENCE TO RELATED APPLICATIONS

Not applicable.

BACKGROUND OF THE INVENTION

The television and other electronic video displays have revolutionized the way that people receive information and entertainment. Initially, televisions were bulky and came in one or two design options. Increasingly, however, consumers have been given a wider array of design choices. New technologies, such as high definition, rear screen projection, projectors, liquid crystal displays and plasma have all increased the number of options available to consumers both in the appearance and the quality of the displays.

Televisions and other electronic devices are often placed in public areas. There are generally placed in these areas in order to either provide entertainment while waiting or to allow multiple people to share a single television. The spread of technology means that these televisions can be hung relatively easily, leading more places to consider placing televisions in public areas. Schools, for example, can easily mount televisions in classrooms. This can provide multiple benefits. For example, school assemblies, video announcements and other school wide broadcasts can be shown in each classroom. Additionally, teachers can use the televisions as visual aids or to show computer monitors or otherwise display information to the entire classroom.

However, televisions in public areas suffer a number of drawbacks. One of the largest is the possibility of damage to the television. Because the television is accessible, it is rather easy for someone to damage or vandalize the television, either on purpose or on accident. For example, the television can be exposed to incidental damage or to vandalism if someone is not around to watch.

In addition, the televisions may be vulnerable to theft. Because the television is left in a public area if a thief sees an opportunity he or she may attempt to steal the television. If the television is mounted, it may suffer damage in the process whether or not the theft is successful. In such cases, the damage may extend to components other than the television including the electronic connections, the mounting hardware, the area where the television is mounted or other damage. Thus, placing the television in a public area may require a greater investment than originally anticipated.

Enclosures for televisions are available. However, these enclosures suffer from a number of drawbacks. In particular, they tend to be very thick. This increases the weight and ruins the sleek look of many televisions, ruining the aesthetic advantages of modern television technology. Additionally, the enclosures may only protect the mounting of the television to the wall in order to prevent theft. Therefore, they do nothing to protect the screen of the television.

Some enclosures include a screen protector. However, this also suffers a number of drawbacks. In particular, the screen protector can distort the optics of the television, making the picture difficult to see. Further, if the area around the television includes bright lights the screen protector may produce a glare which also can make the picture difficult to see. Finally, the full enclosure can make the sound difficult to understand.

If the enclosure is sealed, then it makes vandalism and/or theft difficult. However, this also makes air flow around the television difficult. This can lead to a large amount of heating within the enclosure. This heat can damage the television. Therefore, the enclosure may produce more damage than it prevents.

Further, these enclosures are often made of a single piece of material or pieces welded to one another. Such an approach means that the enclosure must be shipped as a whole unit. Additionally, it makes custom shapes or sizes difficult to construct, because the manufacturing process needs to be modified in order to accommodate changes.

Enclosures for protecting other items suffer similar drawbacks. Accordingly, there is a need in the art for a protector of electronic devices which is visually pleasing to the user. In addition, there is a need in the art for the protector to be light weight. Further, there is a need in the art for the protector to protect the electrical connections of the television. Additionally, there is a need in the art for a protector which allows the electronic device to be easily seen and/or heard while in use.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

One example embodiment includes a system for protecting an electronic display. The system includes an enclosure. The enclosure is configured to receive an electronic display. The system also includes a cover, where the cover is configured to cover the electronic display and attachment means, where the attachment means attaches the enclosure to the electronic display.

Another example embodiment includes a system for protecting an electronic display. The system includes an enclosure. The enclosure is configured to receive an electronic display. The enclosure includes a first side, a second side, where the second side is parallel to the first side, a third side, where the third side connects the first side to the second side and a fourth side, where the fourth side connects the first side to the second side and is parallel to the third side. The system also includes a cover, where the cover is attached to the enclosure and configured to cover the electronic display and attachment means, where the attachment means attaches the enclosure to the electronic display. The system further includes mounting means, where the mounting means allows the system to be mounted to an external structure.

Another example embodiment includes a system for protecting an electronic display. The system includes an enclosure. The enclosure is configured to receive an electronic display. The enclosure includes a first side, a second side, where the second side is parallel to the first side, a third side, where the third side connects the first side to the second side and a fourth side, where the fourth side connects the first side to the second side and is parallel to the third side. The enclosure also includes a backing, where the backing is attached to the first side, the second side, the third side and the fourth side. The system also includes a cover, where the cover is attached to the enclosure and configured to cover the electronic display and attachment means, where the attachment means attaches the enclosure to the electronic display. The system further includes mounting means, where the mounting means allows the system to be mounted to an external structure.

These and other objects and features of the present invention will become more fully apparent from the following description and appended claims, or may be learned by the practice of the invention as set forth hereinafter.

BRIEF DESCRIPTION OF THE DRAWINGS

To further clarify various aspects of some example embodiments of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Reference will now be made to the figures wherein like structures will be provided with like reference designations. It is understood that the figures are diagrammatic and schematic representations of some embodiments of the invention, and are not limiting of the present invention, nor are they necessarily drawn to scale.

Figure 1A:
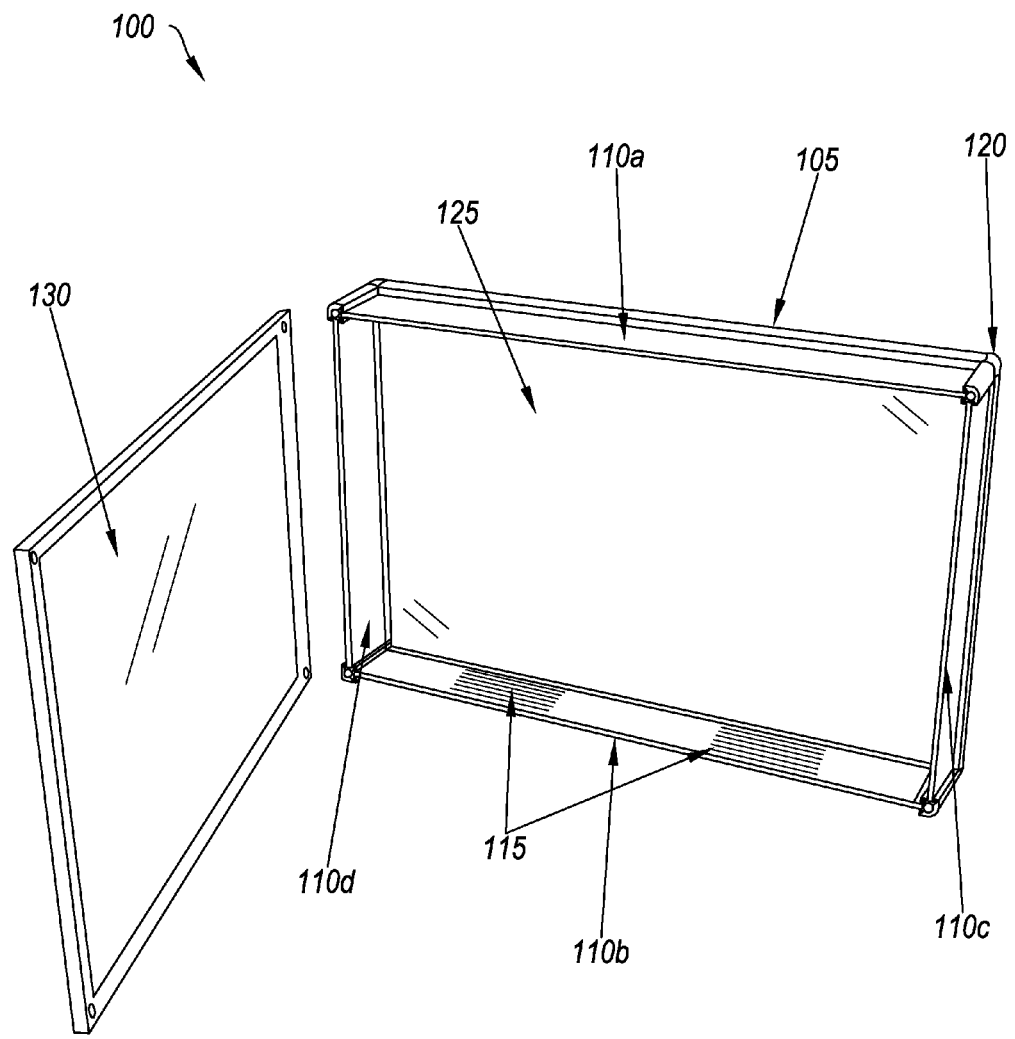
FIG. 1A illustrates a top perspective view of a system for protecting an electronic display.
Figure 1B:
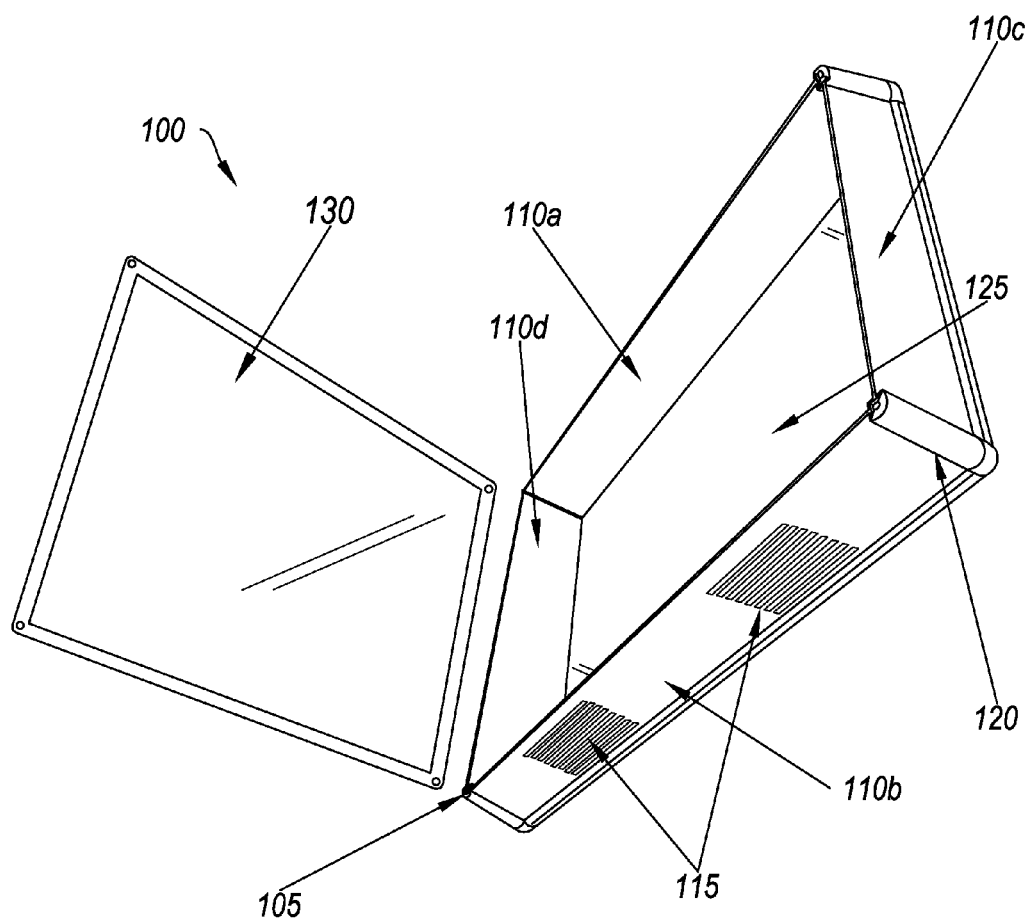
FIG. 1B illustrates a bottom perspective view of the system for protecting the electronic display.

FIGS. 1A and 1B illustrate an example of a system 100 for protecting an electronic display. FIG. 1A illustrates a top perspective view of the system 100 for protecting the electronic display; and FIG. 1B illustrates a bottom perspective view of the system 100 for protecting the electronic display. In at least one implementation, the system 100 can protect the electronic display in a public area. For example, in waiting rooms, sporting venues, outdoors, commercial locations, hospitals, bars, schools, colleges, entertainment complexes and other areas televisions are often hung for showing television programs to patrons. However, these electronic displays can be damaged in a number of ways. For example, the electronic displays can be struck, subject to vandalism, stolen or suffer other damage. One of skill in the art will appreciate that the system 100 can be used for protecting items other than an electronic display without limiting the invention unless otherwise specified in the claims.

FIGS. 1A and 1B show that the system 100 can include an enclosure 105. In at least one implementation, the enclosure 105 is configured to receive the electronic display. In particular, the enclosure 105 can partially or completely surround the electronic display in order to protect it from being damaged. I.e., the enclosure 105 can be external to the electronic display such that any action which has potential to damage the electronic display is instead absorbed by the enclosure 105. Additionally or alternatively, the enclosure 105 can be weather tight. I.e., the enclosure 105 can be configured such that it can protect the electronic display from external conditions such as moisture or sunlight.

In at least one implementation, the enclosure 105 can be made of any material sufficiently strong to protect the electronic display. For example, the enclosure 105 can be made of plastic, wood, metal or any other material. For instance, the enclosure 105 can be made of aluminum or steel. In particular, the enclosure can be made of aluminum or steel extrusions which are easily assembled into the enclosure 105 by connecting the extrusions to one another.

FIGS. 1A and 1B show that the enclosure 105 can include one or more sides 110. In at least one implementation, the enclosure 105 can include a first side 110a, a second side 110b parallel to the first side 110a, a third side 110c connecting the first side 110a to the second side 110b and a fourth side 110d connecting the first side 110a to the second side 110b and parallel to the third side 110c. I.e., the one or more sides 110 can form a rectangular shape. Additionally or alternatively, the one or more sides 110 can form any other shape which is configured to protect the electronic display.

In at least one implementation, the one or more sides 110 can include a vent 115. In at least one implementation, the vent 115 can allow air to enter and exit the enclosure 105. In particular, the air flow through the vent 115 can allow excess heat produced by the electronic display to exit the enclosure 105. I.e., the heat produced by the electronic display can escape through the vent 115 to prevent damage to the electronic display.

FIGS. 1A and 1B also show that the one or more corners 120 formed by the one or more sides 110 can be rounded. In at least one implementation rounded corners 120 can help prevent damage or injury when the system 100 is in use. In particular, the rounded corners 120 can mean that if the enclosure 105 is brought into contact with people or structures, that the enclosure 120 is less likely to cause damage or injury. For example, if the system 100 is mounted on a wall, then moving the system 100 or people walking near the system 100 are less likely to be struck by sharp edges. Additionally or alternatively, the rounded corners 120 can be used assemble the enclosure 105, as described below.

FIGS. 1A and 1B further show that the enclosure 105 can include a backing 125. In at least one implementation, the backing 125 can protect the rear of the electronic display. For example, the backing 125 can be attached to the one or more sides 110 to form a box or container shape. The backing 125 can then cover the rear of the electronic display and protect it from damage or vandalism. Additionally or alternatively, the backing 125 can be used to mount the system 100, as described below. Further, the backing 125 can include one or more grommet holes. The one or more grommet holes can allow cables to pass through the backing 125.

In at least one implementation, the backing 125 can be configured to attach the electronic display. In particular, the backing 125 can include one or more screws which can be attached to the electronic display. For example, many flat panel televisions include holes for mounting the television to a wall. The backing 125 can attach to these holes. Additionally or alternatively, the attachment can include straps, snaps, bolts, or any other fastener known in the art.

In at least one implementation, the backing 125 can further include power, data inputs and outputs or other electronic components for the electronic display. For example, the backing 125 can include a power strip. In at least one implementation, a power strip (also known as an extension lead, power board and by many other variations) is a strip of electrical sockets mounted within or near the enclosure 105. The power strip can allow multiple electronic devices to be plugged in. Further, the power strip can include surge protection or other protection for the electronic devices. Additionally or alternatively, the backing 125 can include video and or audio inputs and outputs, as described below.

FIGS. 1A and 1B also show that the system 100 can include a cover 130. In at least one implementation, the cover 130 can be configured to allow the electronic display to be inserted into and removed from the enclosure 105. Additionally or alternatively, the cover 130 can be configured to allow the electronic display to be accessed as desired. For example, the cover 130 can be configured to open and close such that the cover 130 can be opened and the electronic display accessed.

In at least one implementation, the cover 130 can be made of any material that is configured to protect the electronic display. For example, the cover 130 can include metal, plastic, wood or any other material. Additionally or alternatively, the cover 130 can be configured to allow the electronic display to be viewed or receive optical signals, such as remote control signals. In particular, the cover 130 can include glass or clear plastic. Further, the cover 130 can include an anti-glare covering to prevent bright lights near the cover 130 from obscuring the view of the electronic display.

Figure 2:
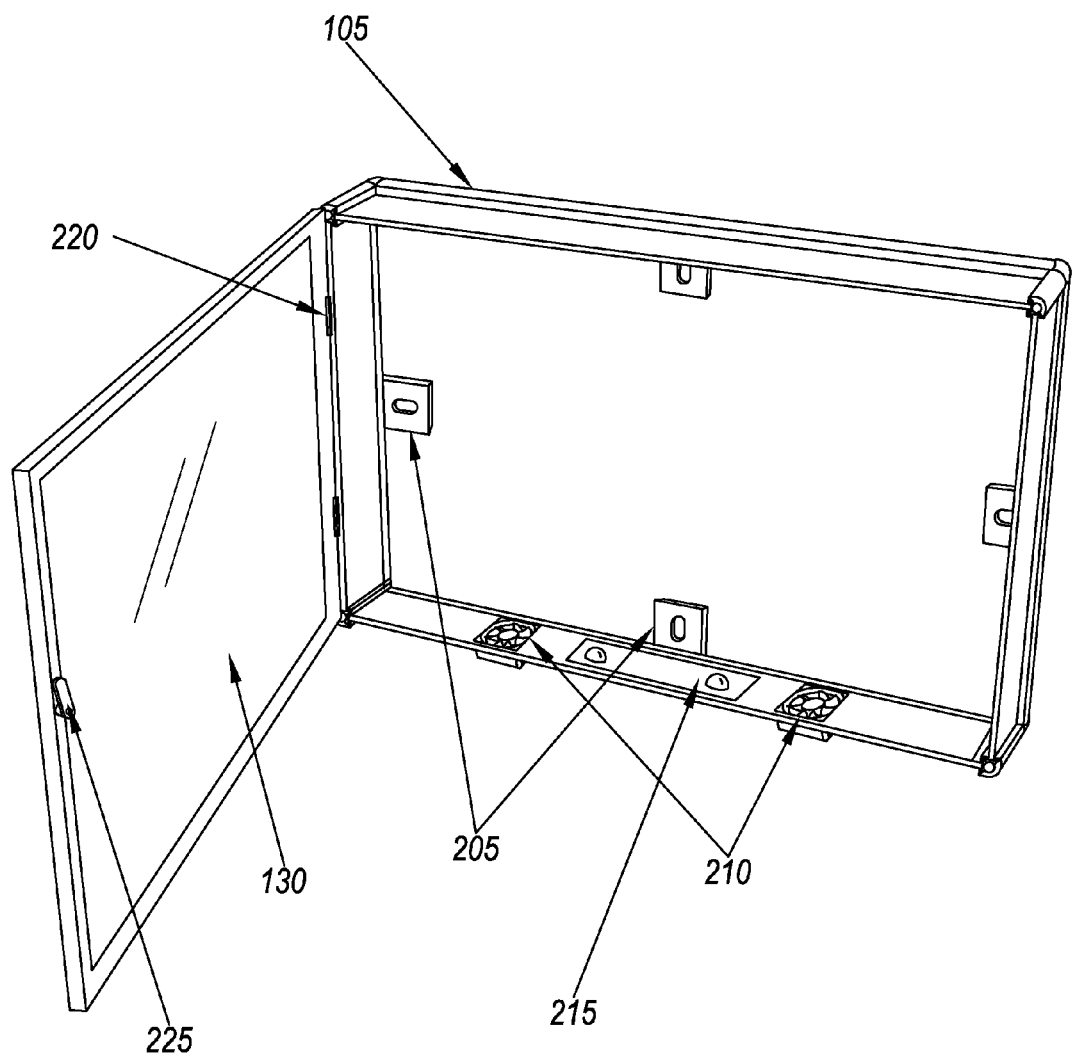
FIG. 2 illustrates an alternative example of an enclosure for protecting an electronic display.

FIG. 2 illustrates an alternative example of an enclosure 105 for protecting an electronic display. In at least one implementation, the enclosure 105 is configured to receive the electronic display. In particular, the enclosure 105 can partially or completely surround the electronic display in order to protect it from being damaged. I.e., the enclosure 105 can be external to the electronic display such that any action which has potential to damage the electronic display is instead absorbed by the enclosure 105.

FIG. 2 shows that the enclosure 105 can include angled mounting brackets 205. In at least one implementation, the angled mounting brackets 205 can be configured to attach the enclosure 105 to a wall or other surface. For example, the mounting brackets 205 can be in the interior of the enclosure 105. Placing the mounting brackets 205 on the interior of the enclosure 105 can allow the mounting brackets 205 to be protected from tampering. In particular, the enclosure 105 can lock or latch, preventing access to the interior of the enclosure 105 and thus the mounting brackets 205, as described below.

FIG. 2 also shows that the enclosure 105 can include one or more fans 210. In at least one implementation, the fans 210 can draw air into or out of the enclosure 105. The air flow produced by the fans 210 can allow excess heat produced by the electronic display to exit the enclosure 105. I.e., the heat produced by the electronic display can be removed by the air flow created by the fans 210 to prevent damage to the electronic display.

FIG. 2 further shows that the fan 210 can include a controller 215. In at least one implementation, the controller 215 can provide power to the fans 210 as needed. For example, the controller 215 can monitor the temperature within the enclosure 105 and turn on the fans if the temperature rises too high. Additionally or alternatively, the controller 215 can turn on the fans whenever the electronic display is being used. The controller 215 can include indicator lights or other mechanisms to alert a user when the fans are currently running.

FIG. 2 also shows that the cover 130 can include one or more hinges 220. In at least one implementation, the one or more hinges 220 can allow the cover 130 to move relative to the enclosure 105. In particular, the one or more hinges 220 can allow the cover 130 to attach to the enclosure 105 while allowing the cover 130 to move such that the interior of the enclosure 105 can be accessed as desired.

FIG. 2 further shows that the cover 130 can include a latch 225. In at least one implementation, the latch 225 can be configured to attach the cover 130 to the enclosure 105. I.e., as the cover 130 moves about the hinges 220 the cover 130 can come into contact with the one or more sides 110. The latch 225 can hold the cover 130 in the closed position. Additionally or alternatively, the latch 225 can include a lock for preventing unwanted access to the electronic display.

Figure 3:
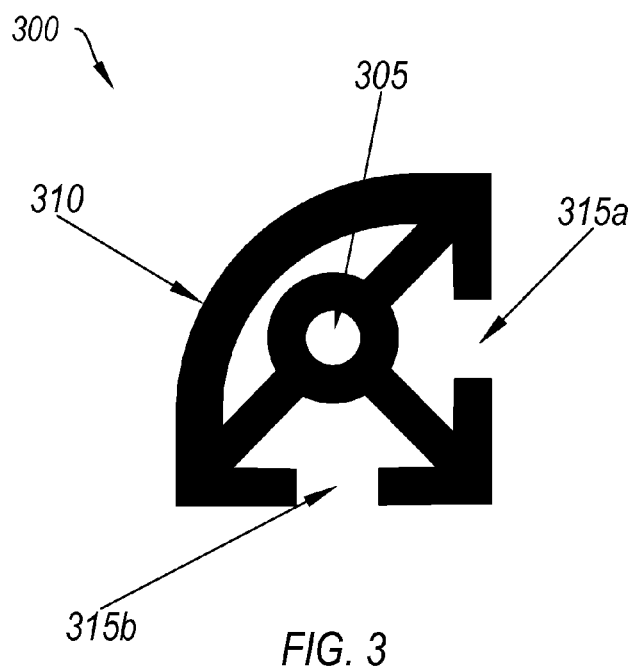
FIG. 3 illustrates an example of an edge.

FIG. 3 illustrates an example of an edge 300. In at least one implementation, the edge 300 can be used to assemble an enclosure, such as the enclosure 105 of FIG. 1. In particular, the edge 300 can be used to attach one or more sides to one another, forming an enclosure, as described below. The edge 300 can be made of metal, wood, plastic or any other material of suitable strength to hold the enclosure together.

FIG. 3 shows that the edge 300 can include a center hole 305. In at least one implementation, the center hole 305 can be used for attaching external hardware. For example, the center hole 305 can be used to attach the cover 130 of FIG. 1. Additionally or alternatively, the center hole 305 can be used to attach the rounded corner 120 of FIG. 1. The center hole 305 can be configured to receive a screw which attaches the external hardware. For example, the center hole 305 can be between 0.16 and 0.24 inches in diameter if the center hole is configured to receive a 0.25 inch diameter screw. In particular, the center hole 305 can be approximately 0.20 inches in diameter. As used in the specification and the claims, the term approximately shall mean that the value is within 10% of the stated value, unless otherwise specified.

FIG. 3 also shows that the edge 300 can include a rounded outer edge 310. In at least one implementation, the rounded outer edge 310 can be used to remove any sharp edges from the completed enclosure. In particular, the edge 300 can be attached to the sides or backing of the enclosure with the rounded outer edge 310 at the most external point. This can help ensure that the enclosure does not damage any other items or people that it comes into contact with. The rounded outer edge 310 can include a diameter between 0.6 inches and 0.9 inches. For example, the rounded outer edge 310 can include a diameter of approximately 0.75 inches.

FIG. 3 further shows that the edge 300 can include a first slot 315a and a second slot 315b (collectively "slots 315"). In at least one implementation, the slots 315 can be used to secure a side of an enclosure to the edge 300. For example, the side can include a lip or edge which is inserted into the first slot 315a. A second edge can be inserted into the second slot 315b completing the attachment. One of skill in the art will appreciate that although the first slot 315a and the second slot 315b are shown perpendicular to one another, angles other than ninety degrees are possible. The one or more slots 315 can be between 0.21 inches and 0.31 inches wide. For example, the one or more slots 315 can be approximately 0.26 inches.

Figures 4A, 4B:
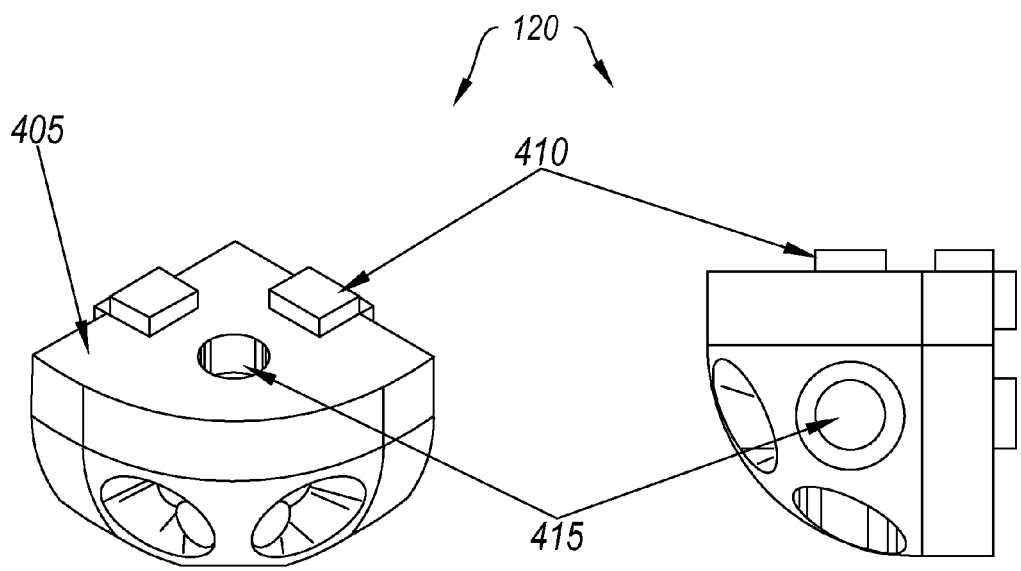
FIG. 4A is a top perspective view of a rounded corner.
FIG. 4B is a side view of the rounded corner.

FIGS. 4A and 4B illustrate an example of a rounded corner 120. FIG. 4A is a top perspective view of the rounded corner 120; and FIG. 4B is a side view of the rounded corner 120. In at least one implementation, the rounded corner 120 can be attached to an edge, such as the edge 300 of FIG. 3. In particular, the rounded corner 120 can be placed where two or three edges 300 come together. The rounded corner 120 can produce a rounded transition between the edges.

FIGS. 4A and 4B show that the rounded corner 120 can include a first surface 405. In at least one implementation, the first surface 405 is configured to be placed flush against the face of the edge to which the rounded corner 120 will be attached. In particular, the first surface 405 can be the same shape as the surface to which it will be attached to ensure that there will not be a gap present.

FIGS. 4A and 4B also show that the rounded corner 120 can include one or more tabs. In at least one implementation, the one or more tabs 410 can be used to position the rounded corner 120. For example, the one or more tabs 410 can be inserted into the slots 315 of FIG. 3. Inserting the one or more tabs 410 within the slots can help prevent lateral movement of the rounded corner relative to the edge to which it is attached.

FIGS. 4A and 4B further show that the rounded corner 120 can include one or more holes 415. In at least one implementation, the one or more holes 415 can allow a screw or other attachment mechanism to be inserted through the rounded corner 120 and into the edge to which the rounded corner will be attached. In particular, the one or more holes 415 can be the same diameter as a hole in the edge so the screw or other attachment mechanism can be secured within both holes. Additionally or alternatively, the one or more holes 415 can include a lip, such that a screw or other attachment mechanism inserted through the hole 415 and secured to the edge provides pressure on the rounded corner 120, securing it to the edge.

Figure 5:
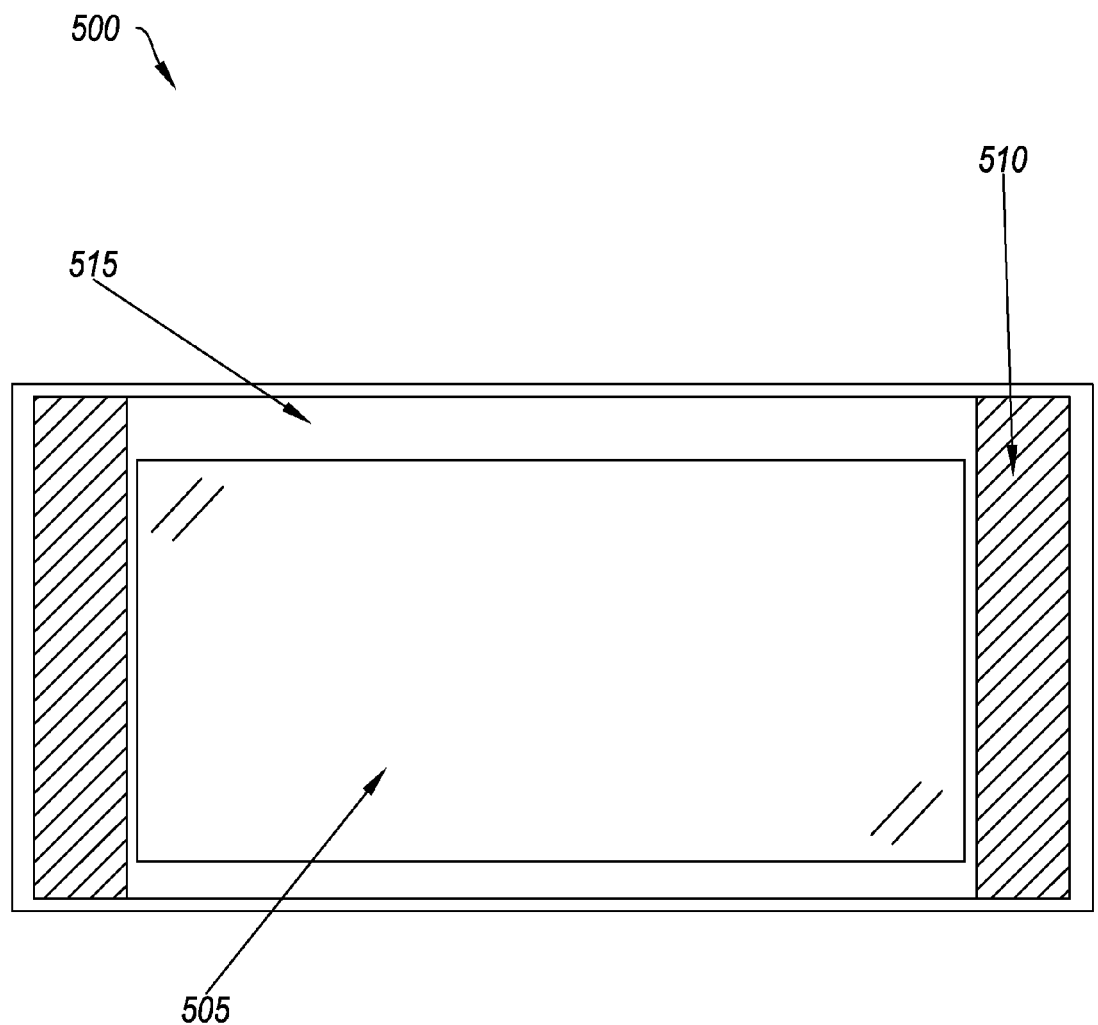
FIG. 5 illustrates an electronic display in accordance with an embodiment of the invention.

FIG. 5 illustrates an electronic display 500. In at least one implementation, the electronic display is any display device for presentation of information for visual, tactile or auditive reception, acquired, stored, or transmitted in electronic form. In particular, an electronic display 500 is a device that receives an electronic signal as input and converts the electronic signal to a sensory signal that can be received by a user. For example, an electronic display 500 can include television sets, computer monitors, video display panels, projectors, liquid crystal displays ("LCD"s), light emitting diode ("LED") displays, electronic game consoles or speakers. One of skill in the art will appreciate that the electronic display 500 can include any other device that converts an electronic signal into a sensory signal unless otherwise stated in the specification or the claims. One of skill in the art will further appreciate that although the electronic display exemplarily includes a television, the electronic display 500 can include any other electronic device.

In at least one implementation, the electronic display 500 can produce multiple types of sensory signals. In particular, the electronic display 500 can include circuitry able to produce an image, which can be viewed by a viewer, and circuitry able to produce sound, which can be heard by the viewer. For example, many televisions and computer monitors are manufactured with built in speakers. One of skill in the art will appreciate that the number of sensory signals produced by the electronic display 500 is not limiting unless otherwise stated in the specification or the claims.

FIG. 5 show that the electronic display 500 can include a screen 505. In at least one implementation, the screen 505 serves as a surface for images to be shown on the electronic display 500. In particular, the electronic display 500 includes display circuitry which broadcasts an image, or series of images, that are shown on the screen 505. For example, the screen 505 can be made of glass, plastic or other material that allows the display circuitry to broadcast the image on one side of the screen 505, while a user views the image from the other side of the screen 505. Additionally or alternatively, the screen 505 can be a projection surface where the display circuitry 500 can broadcast an image that is reflected to a user, who is on the same side of the screen 505 as the electronic display 500. One of skill in the art will appreciate that the location of the display circuitry relative to the screen 505 and to the user is not limiting unless otherwise stated in the specification or the claims.

FIG. 5 also show that the electronic display 500 can include one or more speakers 510. In at least one implementation, the speakers 510 can include an electroacoustic transducer that converts an electrical signal into sound that can be perceived by a user. Specifically, the speaker 510 can move in accordance with the variations of an electrical signal and causes sound waves to propagate through a medium. In particular, the speaker 510 can be used to produce sound from a data signal sent to the electronic display 500. The speaker 510 can be part of the electronic display 500 or can be an external device such as external speakers or headphones.

FIG. 5 further show that the electronic display 500 includes a housing 515. In at least one implementation, the housing 515 substantially encloses the input circuitry and display circuitry of the electronic display 500. Additionally or alternatively, the housing 515 can enclose the edges of the screen 505 and the edges of the speakers 510. In particular, the edges of the screen 505 can be attached to the housing 515 so that the housing 515 can support the screen 505. Attaching the screen 505 to the housing 515 can allow the housing 515 to provide structure for the screen 505. Additionally or alternatively, attaching the screen 505 to the housing 515 can allow the screen 505 to be moved or otherwise manipulated without damaging the screen 505.

In at least one implementation, the housing 515 can be made of metal, plastic or any other material that can substantially enclose the input and display circuitry. Additionally or alternatively, the housing 515 can be made of material that is designed for aesthetic reasons. For example, the housing 515 can be made of materials, such as wood, which are designed to enhance the users experience when using the electronic display 500. One of skill in the art will appreciate that the material used to construct the housing 515 can be changed depending on the elements to be enclosed and the design preferences of the engineer.

Figure 6:
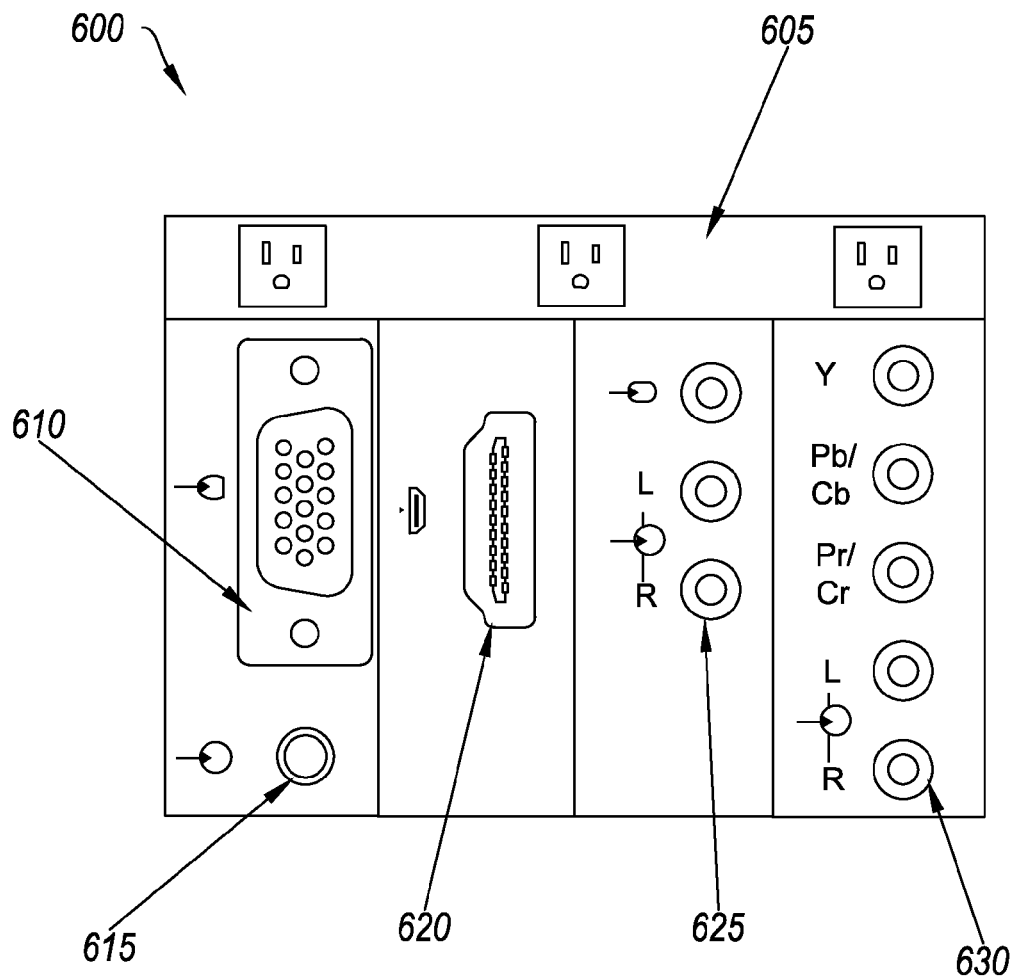
FIG. 6 illustrates an electronic panel for an electronic display.

FIG. 6 illustrates an electronic panel 600 for an electronic display. The electronic panel 600 can allow electrical and data connections to the electronic display placed in the system 100 of FIGS. 1A and 1B. In at least one implementation, the electronic panel 600 can include input circuitry that can allow the electronic display to be connected to external data or electronic ports. For example, the electronic panel 600 can include input circuitry which allows the user to connect the electronic display to cable, satellite TV, an antenna, speakers a computer or any other electronic or data input. In particular, the electronic panel 600 can allow the electronic display to select one of many possible inputs for output on the electronic display.

FIG. 6 shows that the electronic panel 600 can include a power strip 605. In at least one implementation, a power strip 605 is a strip of electrical sockets mounted within or near the enclosure. The power strip 605 can allow multiple electronic devices to be plugged in using a single wall socket. Further, the power strip 605 can include surge protection or other protection for the electronic devices.

FIG. 6 shows that the electronic panel 600 can include a VGA connector 610. In at least one implementation, the VGA connector 610 can include three rows with five pins per row. In particular, the VGA connector 610 can be used to connect a computer or other device to an electronic video display. The VGA connector can include analog component RGBHV (red, green, blue, horizontal sync, vertical sync) video signals, and data.

FIG. 6 also shows that the electronic panel 600 can include a tip, ring, sleeve ("TRS") connector 615 for adding an audio signal to the video signal transmitted by the VGA connector 610. In at least one implementation, the TRS connector 615 can include a stereo audio signal, where the stereo audio signal transmits a separate audio signal for left and right speakers.

FIG. 6 also shows that the input panel can include a High-Definition Multimedia Interface ("HDMI") connector 620. In at least one implementation, an HDMI connector 620 is a compact audio/video interface for transmitting uncompressed digital data. In particular, an HDMI connector 620 can allow for the transmission of both audio and video signals to and from an electronic display. Additionally or alternatively, an HDMI connector 620 can allow a first electronic device to control a second electronic device if connected through an HDMI cable. That is, an HDMI connector 620 can include a consumer electronics connection ("CEC") which allows one electronic device to send control signals to a connected electronic device.

FIG. 6 further shows that the input panel can include an RCA connector 625. In at least one implementation, an RCA connector 625, sometimes called a phono connector or cinch connector, is a type of electrical connector commonly used to carry audio and video signals. For example, an RCA connector 625 can include a composite video connector, a right channel audio connector and a left channel audio connector. In particular, the individual connectors of the RCA connector 625 can be color coded for ease of installation.

FIG. 6 also shows that the electronic panel 600 can include a YPbPr/YCbCr video connector 630. In at least one implementation, the YPbPr/YCbCr video connector 630 includes a color scheme where the video signal is converted into three components. YPbPr is an analog signal and YCbCr is a digital signal. In particular, the Y component can carry luma (brightness) and sync information, the Pb/Cb component can carry the difference between blue and luma (B−Y) and the Pr/Cr component can carry the difference between red and luma (R−Y).

One of skill in the art will appreciate that any combination of inputs in the input panel 600 is contemplated within the scope of the invention. In particular, any combination on inputs which allow an electronic display to receive input electrical signals and to convert the electrical signals to sensory signals that can be perceived by the user is contemplated unless otherwise stated in the specification or the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for protecting an electronic display, the system comprising:
an enclosure, wherein the enclosure:
is configured to receive the electronic display;
includes an edge, wherein the edge includes a slot, wherein the slot:
includes a pair of flanges, wherein the pair of flanges:
extend inwardly toward one another to: secure a portion of a side of the enclosure within the slot; prevent separation of the side relative to the slot;
a cover, wherein the cover is configured to cover the electronic display; and
attachment means, wherein the attachment means attaches the enclosure to the electronic display.

2. The system of claim 1, wherein the electronic display includes a television.

3. The system of claim 1, wherein the electronic display includes a computer monitor.

4. The system of claim 1, wherein the cover is clear plastic.

5. The system of claim 1, wherein the cover is anti-glare.

6. The system of claim 1, wherein the enclosure is plastic.

7. The system of claim 1, wherein the enclosure is metal.

8. The system of claim 7, wherein the enclosure includes aluminum.

9. The system of claim 1 further comprising a corner, wherein the corner:
is rounded;
is configured to attach to the edge; and
includes a tab configured to extend into the slot to position the corner relative to the edge.

10. The system of claim 9, wherein the corner includes a hole, wherein the hole is configured to allow attachment of the corner to the edge.

11. A system for protecting an electronic display, the system comprising:
an enclosure, wherein the enclosure: is configured to receive the electronic display; and includes: a first side; a second side, wherein the second side is parallel to the first side; a third side, wherein the third side connects the first side to the second side; a first edge, wherein the first edge includes: a first slot including a pair of flanges extending inwardly toward one another to secure a portion of the first side within the first slot; and a second slot including a pair of flanges extending inwardly toward one another to secure a portion of the third side within the second slot; a second edge, wherein the second edge includes: a first slot including a pair of flanges extending inwardly toward one another to secure a portion of the second side within the first slot; and a second slot including a pair of flanges extending inwardly toward one another to secure a portion of the third side within the second slot; a fourth side, wherein the fourth side connects the first side to the second side and is parallel to the third side; a third edge, wherein the third edge includes: a first slot including a pair of flanges extending inwardly toward one another to secure a portion of the first side within the first slot; and a second slot including a pair of flanges extending inwardly toward one another to secure a portion of the fourth side within the second slot; and a fourth edge, wherein the fourth edge includes: a first slot including a pair of flanges extending inwardly toward one another to secure a portion of the second side within the first slot; and a second slot including a pair of flanges extending inwardly toward one another to secure a portion of the fourth side within the second slot; wherein each of the pairs of flanges is configured to: allow the corresponding side in the plurality of the sides to move within the slot; and prevent separation of the corresponding side of the plurality of the sides relative to the slot; a cover, wherein the cover is: attached to the enclosure; and configured to cover the electronic display; attachment means, wherein the attachment means attaches the enclosure to the electronic display; mounting means, wherein the mounting means allows the system to be mounted to an external structure.

12. The system of claim 11, wherein the first side includes one or more vent holes.

13. The system of claim 11, wherein the first side includes one or more grommet holes.

14. The system of claim 11, wherein the attachment between the enclosure and the cover includes a hinge.

15. The system of claim 14, wherein the attachment between the enclosure and the cover includes a latch, wherein the latch is opposite the hinge.

16. A system for protecting an electronic display, the system comprising:
an enclosure, wherein the enclosure: is configured to receive the electronic display; and includes: a first side;

a second side, wherein the second side is parallel to the first side; a third side, wherein the third side connects the first side to the second side; a first edge, wherein the first edge includes: a first slot including a pair of flanges extending inwardly toward one another to secure a portion of the first side within the first slot; and a second slot including a pair of flanges extending inwardly toward one another to secure a portion of the third side within the second slot; a second edge, wherein the second edge includes: a first slot including a pair of flanges extending inwardly toward one another to secure a portion of the second side within the first slot; and a second slot including a pair of flanges extending inwardly toward one another to secure a portion of the third side within the second slot; a fourth side, wherein the fourth side connects the first side to the second side and is parallel to the third side; a third edge, wherein the third edge includes: a first slot including a pair of flanges extending inwardly toward one another to secure a portion of the first side within the first slot; and a second slot including a pair of flanges extending inwardly toward one another to secure a portion of the fourth side within the second slot; a fourth edge, wherein the fourth edge includes: a first slot including a pair of flanges extending inwardly toward one another to secure a portion of the second side within the first slot; and a second slot including a pair of flanges extending inwardly toward one another to secure a portion of the fourth side within the second slot; wherein each of the pairs of flanges is configured to: allow the corresponding side of the plurality of the sides to move within the slot; and prevent separation of the corresponding side in the plurality of the sides relative to the slot; and a backing, wherein the backing is attached to the first side, the second side, the third side and the fourth side; a cover, wherein the cover is: attached to the enclosure; and configured to cover the electronic display; attachment means, wherein the attachment means attaches the enclosure to the electronic display; mounting means, wherein the mounting means allows the system to be mounted to an external structure.

17. The system of claim 16 further comprising a fan.
18. The system of claim 16 further comprising a speaker.
19. The system of claim 16 further comprising a power strip.
20. The system of claim 16 further comprising one or more data connectors, wherein the one or more data connectors are configured to receive one of:
   audio input;
   audio output;
   video input; or
   video output.

* * * * *